(12) United States Patent
Schmidt et al.

(10) Patent No.: US 11,651,911 B2
(45) Date of Patent: May 16, 2023

(54) METHOD FOR OPERATING AN ELECTRICAL TREATMENT DEVICE AND ELECTRICAL TREATMENT DEVICE

(71) Applicant: Andreas Stihl AG & Co. KG, Waiblingen (DE)

(72) Inventors: Tobias Schmidt, Esslingen (DE); Kay-Steffen Gurr, Heilbronn (DE); Marc Saemann, Geislingen (DE); Rudolf Saemann, Balingen (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 374 days.

(21) Appl. No.: 17/014,020

(22) Filed: Sep. 8, 2020

(65) Prior Publication Data
US 2021/0074489 A1    Mar. 11, 2021

(30) Foreign Application Priority Data
Sep. 9, 2019   (EP) .................................... 19196206

(51) Int. Cl.
*H01H 9/54* (2006.01)
*H02P 1/16* (2006.01)
(Continued)

(52) U.S. Cl.
CPC ........... *H01H 9/54* (2013.01); *G01R 31/3277* (2013.01); *G01R 31/34* (2013.01); *H02K 7/145* (2013.01);
(Continued)

(58) Field of Classification Search
CPC .............. H01H 9/54; H02P 1/16; H02P 29/40
See application file for complete search history.

(56) References Cited

U.S. PATENT DOCUMENTS

| 4,893,067 A | 1/1990 | Bhagwat et al. |
| 10,014,804 B1 * | 7/2018 | Maurin ..................... H02P 1/28 |

(Continued)

FOREIGN PATENT DOCUMENTS

| DE | 10 2016 004 525 A1 | 10/2017 | |
| EP | 2568559 A2 * | 3/2013 | ............... H02H 3/44 |

(Continued)

OTHER PUBLICATIONS

Cover page of EP 3 074 187 A1 published Oct. 5, 2016 (one (1) page).

*Primary Examiner* — Sisay G Tiku
(74) *Attorney, Agent, or Firm* — Crowell & Moring LLP

(57) ABSTRACT

A method operates an electrical treatment device having a user-operable operating switch, and a motor electronics system with a motor control and an electric drive motor. The switch electrically connects to a drive voltage source and the motor electronics system. The motor electronics system electrically connects to the drive motor on an output side via the motor control. The method monitors whether an input voltage at the motor electronics system meets a closed criterion or an open criterion, wherein the closed criterion is characteristic of a closed switching state of the operating switch, and wherein the open criterion is characteristic of an open switching state of the operating switch, and when the open criterion is met, operates the motor control in a state from an open state set that includes a voltage control state for limiting an increase in the input voltage caused by the running-down electric drive motor.

14 Claims, 5 Drawing Sheets

(51) Int. Cl.
*H02P 29/40* (2016.01)
*H02K 11/33* (2016.01)
*G01R 31/327* (2006.01)
*G01R 31/34* (2020.01)
*H02K 7/14* (2006.01)

(52) U.S. Cl.
CPC ........... *H02K 11/33* (2016.01); *H02P 1/16*
(2013.01); *H02P 29/40* (2016.02)

(56) References Cited

U.S. PATENT DOCUMENTS

| | | | |
|---|---|---|---|
| 10,063,165 B2 * | 8/2018 | Gurr | H02P 1/02 |
| 10,486,295 B2 | 11/2019 | Aradachi et al. | |
| 2009/0179062 A1 * | 7/2009 | Shima | B25C 1/06 |
| | | | 227/2 |
| 2009/0194574 A1 * | 8/2009 | Shima | B25C 1/06 |
| | | | 227/136 |
| 2012/0249027 A1 * | 10/2012 | Wichert | G01R 31/34 |
| | | | 318/400.3 |
| 2013/0027817 A1 * | 1/2013 | Keeramthode | H02H 3/44 |
| | | | 361/87 |
| 2017/0217004 A1 | 8/2017 | Kato | |
| 2018/0062544 A1 * | 3/2018 | Vaneyll | H02P 1/16 |
| 2020/0373870 A1 * | 11/2020 | Ramesh Chandran | H02P 27/06 |

FOREIGN PATENT DOCUMENTS

| | | | | |
|---|---|---|---|---|
| EP | 2671681 A2 * | 12/2013 | | B23Q 5/10 |
| EP | 2 875 905 B1 | 10/2016 | | |
| EP | 3 236 483 A1 | 10/2017 | | |
| JP | 5002979 B2 | 8/2012 | | |
| JP | 2017200412 A * | 11/2017 | | |
| JP | 2019-118963 A | 7/2019 | | |
| WO | WO 2015/079691 A1 | 6/2015 | | |
| WO | WO-2015147331 A1 * | 10/2015 | | B25F 5/00 |
| WO | WO-2015166547 A1 * | 11/2015 | | B60L 53/20 |

* cited by examiner

METHOD FOR OPERATING AN ELECTRICAL TREATMENT DEVICE AND ELECTRICAL TREATMENT DEVICE

CROSS REFERENCE TO RELATED APPLICATION

This application claims priority under 35 U.S.C. § 119 from German Patent Application No. 19196206.7, filed Sep. 9, 2020, the entire disclosure of which is herein expressly incorporated by reference.

BACKGROUND AND SUMMARY OF THE INVENTION

The invention relates to a method for operating an electrical treatment device and an electrical treatment device.

The underlying object of the invention is to provide a method for operating an electrical treatment device and an electrical treatment device which in each case has improved properties.

The invention achieves this object by providing a method and an electrical treatment device in accordance with the independent claims. Advantageous developments and/or configurations of the invention are described in the dependent claims.

The method according to the invention is designed or configured to, in particular automatically, operate an electrical treatment device. The treatment device has a user-operable operating switch, a motor electronics system having a, in particular electric, motor control and an electric drive motor. The operating switch is electrically connected or connected in series to a, in particular electric, drive voltage source on the input side and to the motor electronics system on the output side. The motor electronics system is electrically connected or connected in series to the electric drive motor on the output side by means of the motor control. The method includes the steps: a) monitoring, in particular automatically monitoring, whether an input voltage at the motor electronics system meets, in particular either, a closed criterion or an open criterion. The closed criterion is characteristic of a closed switching state of the operating switch. The open criterion is characteristic of an open switching state of the operating switch; b) if the open criterion is met, operating, in particular automatically operating, the motor control in a state or mode from an open state set or open mode set. The open state set includes a voltage control state or voltage control mode for, in particular automatically, limiting an increase in the input voltage caused by the running-down or coasting electric drive motor, in particular in the open switching state of the operating switch.

This, in particular the voltage control state, makes it possible to avoid undesirable effects, in particular depending on if the closed criterion is erroneously met, despite the operating switch being able to have the open switching state.

In particular, the treatment device can be a hand-guided, in particular floor-guided or hand-held, treatment device. In particular, a hand-guided, in particular hand-held, treatment device can mean that the treatment device can have a maximum mass of 50 kilograms (kg), in particular 20 kg, in particular 10 kg. Additionally or alternatively, the treatment device can be a gardening device, forestry device and/or construction device. In particular, the treatment device can be a saw, a tree pruner, a strimmer, a hedge trimmer, a hedge cutter, a blowing apparatus, a leaf blower, a lopper, a grinder, a sweeping device, a sweeping roller, a sweeping brush, a lawnmower, a scarifier or grass shears. Further additionally or alternatively, the electric drive motor can be designed to drive a treatment tool of the treatment device.

The operating switch can be designed to produce an electrical connection between the drive voltage source and the motor electronics system in the closed switching state, and to disconnect it in the open switching state. Additionally or alternatively, the operating switch can be described as a disconnecting switch. Further additionally or alternatively, the treatment device can be designed in such a way that the operating switch can be directly or indirectly operable by a user. Further additionally or alternatively, the operating switch can be an operating switch which self-resets in the open switching state. Further additionally or alternatively, the treatment device can have a power path, wherein the power path can electrically connect the drive voltage source to the motor electronics system on the input side for a flow of electric drive power from the drive voltage source to the motor electronics system, in particular in the closed switching state of the operating switch, wherein the operating switch can be arranged in an electrical manner or connected in series in the power path. In particular, the power path can be described as a power line.

The motor electronics system can have a motor electronics circuit board. Additionally or alternatively, the motor electronics system can be electrically connected to the operating switch on the input side, in particular on the output side.

The motor control can be described as an output stage.

Monitoring can include measuring the input voltage.

The closed criterion and the open criterion can be different.

Step a) can be performed continuously. Additionally or alternatively, step b) can be performed at the same time as and/or temporally after step a). Further additionally or alternatively, step b) can be performed until the closed criterion can be met.

The state from the open state set, in particular the voltage control state, does not need to or cannot make it possible to supply the electric drive motor with electrical output power from the drive voltage source.

In a development of the invention, the electric drive motor has a mechanical commutator. In particular, the electric drive motor is a direct current machine. The electric drive motor and thus the treatment device can therefore be relatively cost-effective. In particular, the mechanical commutator can cause commutation peaks or high commutation pulses or demolition sparks when the electric drive motor is running down, wherein the commutation peaks can cause the input voltage to increase. In particular, brushes of the commutator can in each case touch two blades of the commutator for a short time and thus cause the demolition sparks.

In a development of the invention, the closed criterion is that the input voltage is equal to or greater than a first voltage threshold value and/or that an, in particular temporal, increase in the input voltage is equal to or greater than a, in particular temporal, voltage increase threshold value.

Additionally or alternatively, the open criterion is that the input voltage is equal to or smaller than a second voltage threshold value and/or that a, in particular temporal, drop in the input voltage is equal to or smaller than a, in particular temporal, voltage drop threshold value.

The voltage control state makes it possible to prevent the closed criterion from being erroneously met, despite the operating switch being able to have the open switching state. In other words: the voltage control state makes it possible for the monitoring of whether the input voltage meets the closed criterion, in particular or the open criterion, to be able to function. In particular, monitoring can include comparing the input voltage with the first voltage threshold value and/or the second voltage threshold value.

In a development, in particular a configuration, of the invention, the treatment device has a, in particular the, power path and an information path which is different from the power path. The power path electrically connects the drive voltage source to the motor electronics system on the input side for a flow of electric drive power from the drive voltage source to the motor electronics system, in particular in the closed switching state of the operating switch. The operating switch is arranged in an electrical manner or connected in series in the power path. The information path electrically connects, in particular continuously, the drive voltage source to the motor electronics system for information regarding a voltage source value of the drive voltage source. The method includes the step: specifying, in particular automatically specifying, the closed criterion, in particular the first voltage threshold value and/or the voltage increase threshold value, if applicable, and/or the open criterion, in particular the second voltage threshold value and/or the voltage drop threshold value, if applicable, depending on the information provided regarding the voltage source value. This makes it possible for the closed criterion and/or the open criterion to be actively adapted to the voltage source value. In particular, the drive voltage source can have an accumulator. The voltage source value can drop with increasing discharge of the accumulator. Additionally or alternatively, the information can be the voltage source value. Further additionally or alternatively, the information path does not need to or cannot electrically connect the drive voltage source to the motor electronics system for a flow of electric drive power from the drive voltage source to the motor electronics system. Further additionally or alternatively, the information path can be described as a bypass line. Further additionally or alternatively, the operating switch does not need to be or cannot be arranged in the information path in an electrical manner. Further additionally or alternatively, the power path can be described as a power line. Further additionally or alternatively, monitoring can include measuring the voltage source value and/or comparing the input voltage with the voltage source value.

In one configuration of the invention, the second voltage threshold value is smaller than the first voltage threshold value. In particular, the second voltage threshold value is at least 0.75 volts (V), in particular 1.5 V, smaller than the first voltage threshold value. Additionally or alternatively, the second voltage threshold value falls within a range from 0.8 times to 0.9 times the first voltage threshold value.

Additionally or alternatively, the first voltage threshold value is smaller than the voltage source value. In particular, the first voltage threshold value is at least 0.25 V, in particular 0.5 V, smaller than the voltage source value. Further additionally or alternatively, the first voltage threshold value falls within a range from 0.85 times to 0.95 times the voltage source value.

Further additionally or alternatively, the first voltage threshold value falls within a range from 7.5 V to 20.5 V, in particular to 11.5 V.

Further additionally or alternatively, the second voltage threshold value falls within a range from 6 V, in particular from 7.5 V, to 20.5 V, in particular to 10 V.

Further additionally or alternatively, the voltage source value falls within a range from 8 V to 20.5 V, in particular to 12 V.

At these low voltage values, monitoring whether the input voltage meets the closed criterion, in particular or the open criterion, does not need to or cannot function without the voltage control state according to the invention, in particular in contrast to high voltage values, such as 36 V, for example. In particular, at these low voltage values, the input voltage can remain approximately at the level of the drive voltage or the voltage source value without the voltage control state according to the invention for a long time. As a result, a rapid voltage increase in this area does not need to be or cannot be identified upon renewed operation of the operating switch. This means that a switch identification or identification of the switching state therefore does not need to be or cannot be possible in a longer period. In particular, a nominal voltage of the drive voltage source can be 10.8 V or 18 V.

In a development of the invention, the method includes the step: c) if the closed criterion is met, operating, in particular automatically operating, the motor control in an active state or active mode for, in particular automatically, supplying the electric drive motor with electrical output power from the drive voltage source, in particular in the closed switching state of the operating switch. This, in particular the active state, makes it possible to run the electric drive motor, in particular in the closed switching state of the operating itch. In particular, step c) can be performed temporally before and/or after step b). Additionally or alternatively, either step c) or step b) can be performed. Further additionally or alternatively, step c) can be performed at the same time as and/or temporally after step a). Further additionally or alternatively, step c) can be performed until the open criterion can be met. Further additionally or alternatively, in the open switching state of the operating switch, the active state can make it possible for, in particular cause, the input voltage to drop and thus for the open criterion to be met. Further additionally or alternatively, the active state does not need to be or cannot be from the open state set. In particular, the active state can be different from the voltage control state. Further additionally or alternatively, step c) can include: operating the motor control in the active state for, in particular automatically, maintaining an output voltage at the motor electronics system, in particular the motor control, or the electric drive motor at a, in particular constant, voltage value, in particular with electrical output power from the drive voltage source and/or in the closed switching state of the operating switch. In particular, the voltage value of the output voltage can be or is specified depending on the information provided regarding the voltage source value and/or information regarding the electric drive motor.

In a development of the invention, the open state set includes the voltage control state for, in particular automatically, permitting an increase in the input voltage caused by the drive voltage source in the closed switching state of the operating switch. This, in particular the voltage control state, makes it possible for the closed criterion to be met in the closed switching state of the operating switch. This therefore makes it possible for the monitoring of whether the input voltage meets the closed criterion, in particular or the open criterion, to be able to function.

In a development of the invention, the open state set includes the voltage control state for, in particular automatically, maintaining the input voltage at a, in particular constant, voltage value, in particular the second voltage threshold value, in particular in the open switching state of the operating switch. This makes it possible to firstly prevent a further drop in the input voltage. This therefore makes it possible to keep an inrush current low upon renewed operation or in the closed switching state of the operating switch. This therefore makes it possible to prevent damage to the motor electronics system. In particular, the voltage value, in particular the second voltage threshold value, can fall within a range as described previously. Additionally or alternatively, maintaining the voltage value can mean that the input voltage can be maintained within a narrow range, for example plus/minus 0.25V, around the voltage value.

In a development of the invention, the open state set includes an inactive state or inactive mode which is different from the voltage control state for, in particular automatically, not limiting an increase in the input voltage caused by the running-down electric drive motor, in particular in the open switching state of the operating switch. Step b) includes: temporally after operating the motor control in the voltage control state, operating the motor control in the inactive state, in particular automatically. In particular, operation in the inactive state can be a non-operation. Additionally or alternatively, step b) can include operating the motor control in the inactive state if the input voltage can no longer be maintained at the voltage value, if applicable, and/or if the electric drive motor, which is running down or has run down, cannot cause a high increase, or even any increase, in the input voltage. Further additionally or alternatively, the inactive state can be different from the active state.

In a development of the invention, the motor control has at least one, in particular first, motor switch element and at least one, in particular first, protective element, in particular a protective diode, for protecting the motor switch element, in particular from damage caused by the running-down electric drive motor. The protective element enables an increase in the input voltage caused by the running-down electric drive motor. In particular, the protective element can be arranged in an electrical manner or connected antiparallel to the motor switch element. Additionally or alternatively, the protective diode can be described as a free-wheeling diode or body diode. Further additionally or alternatively, the motor switch element can be a transistor.

In a development, in particular configuration, of the invention, the motor control has a, in particular, the controllable first motor switch element and/or a controllable second motor switch element. The first motor switch element is arranged in an electrical manner or connected in series after the operating switch and before the electric drive motor. The second motor switch element is arranged in an electrical manner or connected parallel to the electric drive motor.

Operating the motor control in the active state, if applicable, includes: controlling, in particular automatically controlling, the first motor switch element alternately in an on state and in an off state, in particular by means of pulse width modulation. Additionally or alternatively, operating the motor control in the voltage control state includes: controlling, in particular automatically controlling, the first motor switch element alternately in the on state and in the off state, in particular by means of pulse width modulation. Further additionally or alternatively, operating the motor control in the inactive state includes: controlling, in particular automatically controlling, the first motor switch element continuously in the off state.

Additionally or alternatively, operating the motor control in the active state includes: controlling, in particular automatically controlling, the second motor switch element alternately in an on state and in an off state, in particular by means of pulse width modulation. Additionally or alternatively, operating the motor control in the voltage control state includes: controlling, in particular automatically controlling, the second motor switch element alternately in the on state and in the off state, in particular by means of pulse width modulation. Further additionally or alternatively, operating the motor control in the inactive state includes: controlling, in particular automatically controlling, the second motor switch element continuously in the off state.

The control in the active state makes it possible to supply the electric drive motor with electrical output power from the drive voltage source in the closed switching state of the operating switch and/or for the input voltage to drop in the open switching state of the operating switch.

Additionally or alternatively, the control in the voltage control state makes it possible to limit the increase in the input voltage, in particular maintain the input voltage, in the open switching state, and/or to permit the increase in the input voltage in the closed switching state of the operating switch.

Further additionally or alternatively, the control in the inactive state, in particular in the open switching state of the operating switch, makes it possible to not limit the increase in the input voltage.

In particular, the first motor switch element and the second motor switch element can be operated as voltage controllers, in particular as voltage regulators. Additionally or alternatively, the first motor switch element and the second motor switch element can be different. Further additionally or alternatively, the first motor switch element can be described as a high-side switch element and/or the second motor switch element can be described as a low-side switch element. Further additionally or alternatively, the second motor switch element and/or the electric drive motor can in each case be arranged in an electrical manner or connected in series after the first motor switch element and before ground. Further additionally or alternatively, the first motor switch element and the second motor switch element can in each case be a transistor. Further additionally or alternatively, the on state and the off state can be different. Further additionally or alternatively, the on state can be described as a conductive state and/or the off state can be described as a non-conductive or disconnected state. Further additionally or alternatively, continuous can be described as permanent and/or can mean in the one state and not in the other state. Further additionally or alternatively, operating the motor control in the active state and/or in the voltage control state can include: controlling the first motor switch element and the second motor switch element by means of complementary pulse width modulation.

In a development of the invention, the motor electronics system has at least one intermediate circuit capacitor. The input voltage is an intermediate circuit voltage of the at least one intermediate circuit capacitor. In particular, the intermediate circuit capacitor can be arranged in an electrical manner or connected in series after the operating switch and before the, in particular first, motor switch element and/or before the protective element and/or before ground. Additionally or alternatively, the intermediate circuit capacitor, the protective diode, the second motor switch element, in particular the first motor switch element, and the electric drive motor can form a step-up converter or a boost converter, in particular at least partially or even fully.

In a development of the invention, the method includes the step: if the closed criterion is met, performing, in particular automatically performing, a self-test of the treatment device and/or outputting, in particular automatically outputting, user-accessible information, in particular depending on a result of the self-test. The voltage control state enables the performing of the self-test and/or the output to only take place if the operating switch has the closed switching state. This, in particular the voltage control state, therefore makes it possible to avoid undesirable effects, in particular depending on if the closed criterion is erroneously met, despite the operating switch being able to have the open switching state. In particular, an undesirable effect could be that a result of the self-test is that the closed criterion is met, despite the operating switch having the open switching state, and thus is identified as an error, and that this error is outputted. Additionally or alternatively, the output can be an optical and/or acoustic output.

The electrical treatment device according to the invention has a, in particular the, user-operable operating switch, a, in particular the, motor electronics system having a, in particular the, motor control and having a, in particular electrical, monitoring and control apparatus and an, in particular the, electric drive motor. The operating switch is designed to electrically connect to a, in particular the, drive voltage source on the input side and is electrically connected to the motor electronics system on the output side. The motor electronics system is electrically connected to the electric drive motor on the output side by means of the motor control. The monitoring and control apparatus is designed or configured to, in particular automatically, monitor whether an, in particular the, input voltage at the motor electronics system meets, in particular either, a, in particular the, closed criterion or an, in particular the, open criterion. The closed criterion is characteristic of a, in particular the, closed switching state of the operating switch. The open criterion is characteristic of an, in particular the, open switching state of the operating switch. Moreover, if the open criterion is met, the monitoring and control apparatus is designed or configured to, in particular automatically, operate the motor control in a, in particular the, state from an, in particular the, open state set. The open state set includes a, in particular the, voltage control state for, in particular automatically, limiting an, in particular the, increase in the input voltage caused by the running-down electric drive motor.

The treatment device can make the same advantage(s) possible as described for the method previously.

In particular, the treatment device, in particular the monitoring and control apparatus, can be designed or configured to perform a method as described previously. Additionally or alternatively, the treatment device can be designed or configured as described previously for the method. Further additionally or alternatively, the monitoring and control apparatus can have, in particular be, a microcontroller. Further additionally or alternatively, the treatment device can be designed to bear, in particular to receive, in particular in an exchangeable manner, the drive voltage source having the accumulator.

In a development of the invention, the treatment device has the drive voltage source. In particular, the drive voltage source has an, in particular the, accumulator. In particular, the operating switch is electrically connected to the drive voltage source on the input side. Additionally or alternatively, the drive voltage source can be designed as an exchangeable drive voltage source.

Further advantages and aspects of the invention are set forth in the claims and in the following description of preferred exemplary embodiments of the invention, which are explained hereinafter using the figures.

DETAILED DESCRIPTION OF THE DRAWINGS

Figure 1:
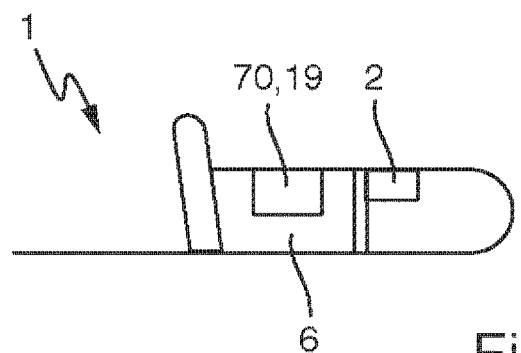
FIG. 1 shows a schematic view of an electrical treatment device according to an embodiment of the invention.
Figure 2:
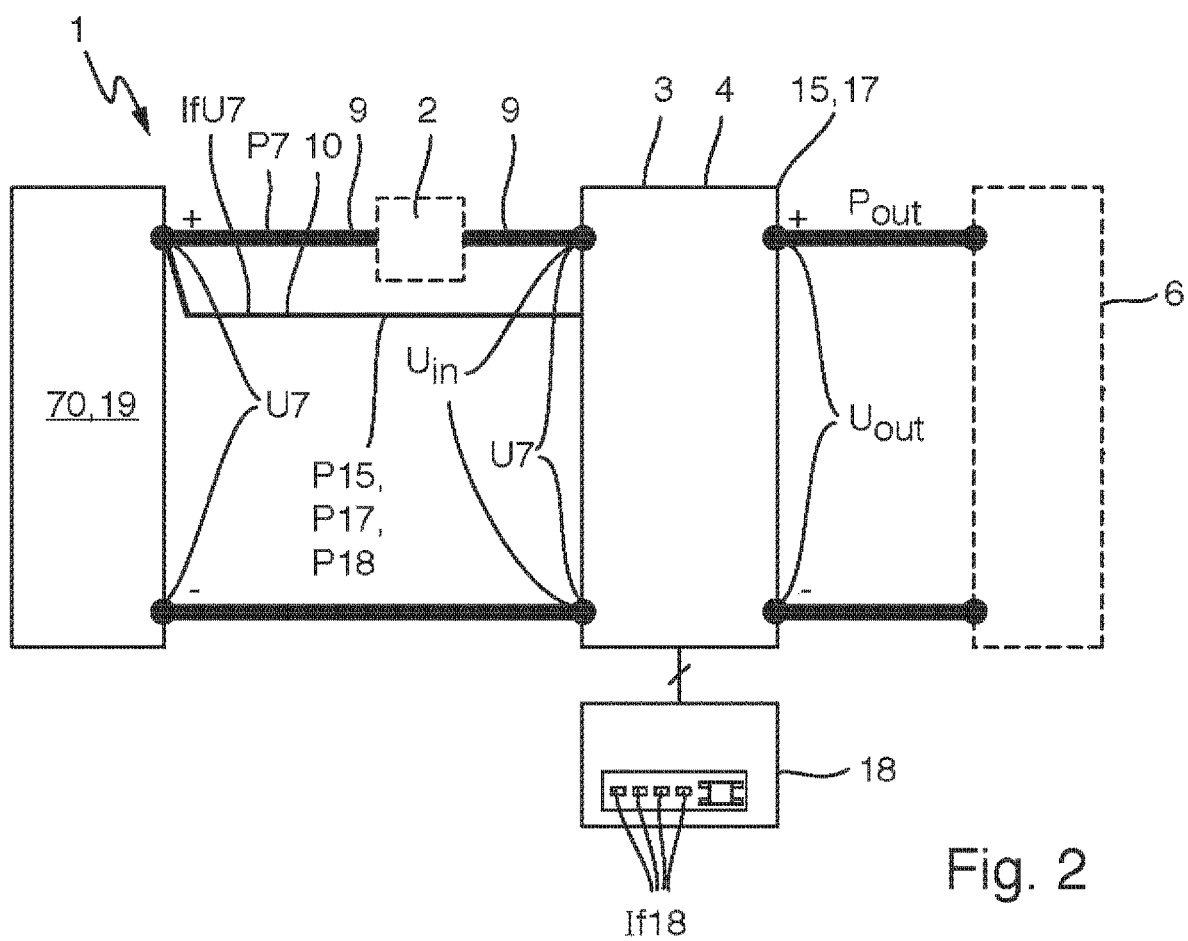
FIG. 2 shows an equivalent circuit diagram of the treatment device from FIG. 1.

FIGS. 1 to 4 show an electrical treatment device 1. The treatment device 1 has a user-operable operating switch 2, a motor electronics system 3 having a motor control 4 and having a monitoring and control apparatus 15 and an electric drive motor 6. The operating switch 2 is designed to electrically connect to a drive voltage source 70 on the input side and is electrically connected to the motor electronics system 3 on the output side. The motor electronics system 3 is electrically connected to the electric drive motor 6 on the output side by means of the motor control 4. The monitoring and control apparatus 15 is designed to monitor whether an input voltage Uin at the motor electronics system 3 meets a closed criterion ck or an open criterion ok. The closed criterion ck is characteristic of a closed switching state closed of the operating switch 2. The open criterion ok is characteristic of an open switching state open of the operating switch 2. Moreover, if the open criterion ok is met, the monitoring and control apparatus 15 is designed to operate the motor control 4 in a state SZ, IZ from an open state set. The open state set includes a voltage control state SZ for limiting an increase in the input voltage Uin caused by the running-down electric drive motor 6, in particular in the open switching state open of the operating switch 2.

Figure 8:
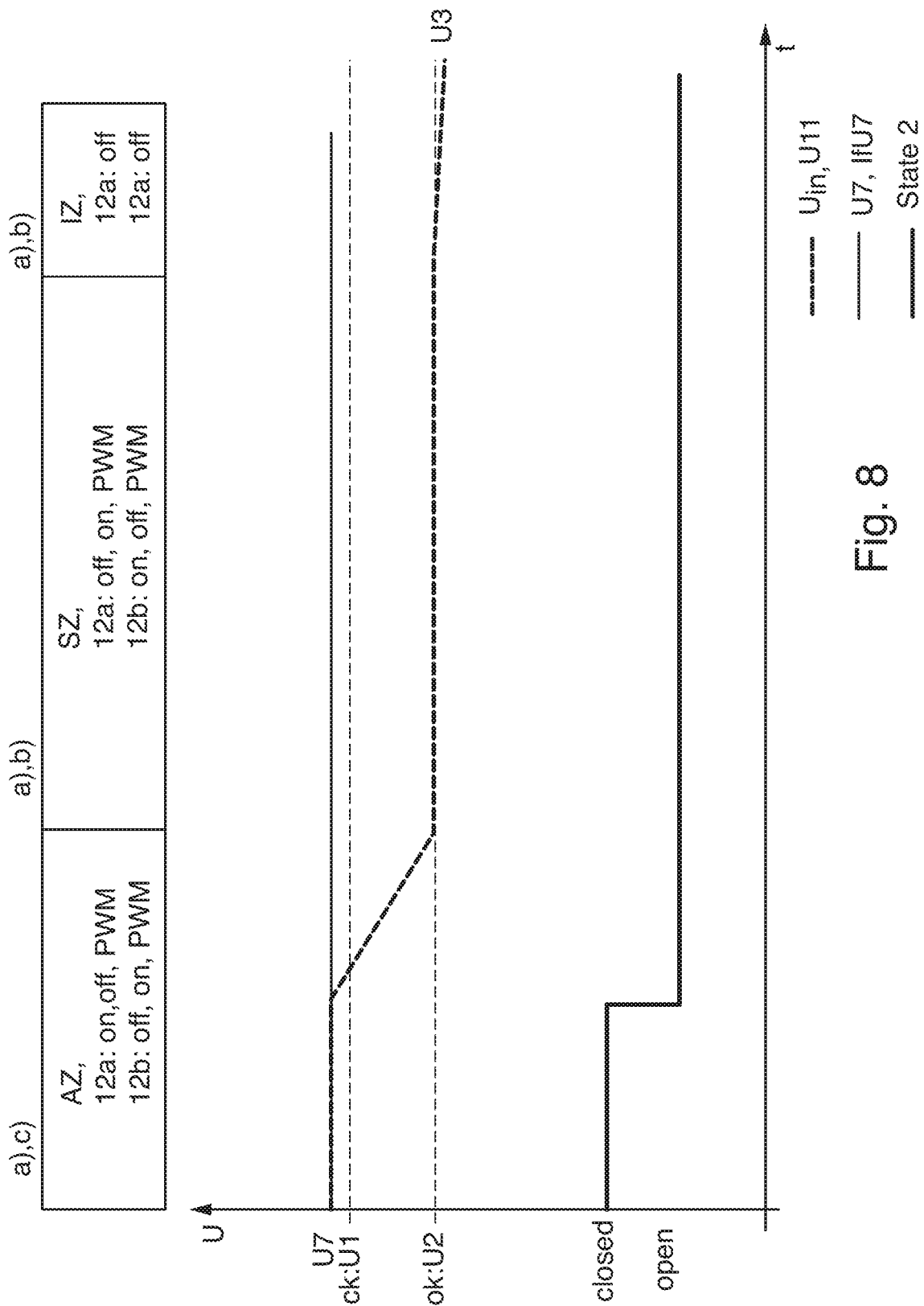
FIG. 8 shows a flow diagram, in particular a graph of a switching state of a user-operable operating switch of the treatment device from FIG. 1 and an input voltage at a motor electronics system of the treatment device from FIG. 1 over time, of a method according to an embodiment of the invention.

FIG. 8 shows a method according to the invention for operating the electrical treatment device 1, in particular by means of the monitoring and control apparatus 15. The treatment device 1 has the user-operable operating switch 2, the motor electronics system 3 having the motor control 4 and the electric drive motor 6. The operating switch 2 is electrically connected to the drive voltage source 70 on the input side and to the motor electronics system 3 on the output side. The motor electronics system 3 is electrically connected to the electric drive motor 6 on the output side by means of the motor control 4. The method includes the steps: a) monitoring whether the input voltage Uin at the motor electronics system 3 meets the closed criterion ck or the open criterion ok, in particular by means of the monitoring and control apparatus 15. The closed criterion ck is characteristic of the closed switching state closed of the operating switch 2. The open criterion ok is characteristic of the open switching state open of the operating switch 2. b) if the open criterion is met, operating the motor control 4 in the state SZ, IZ from the open state set, in particular by means of the monitoring and control apparatus 15. The open state set includes the voltage control state SZ for limiting the increase in the input voltage Uin caused by the running-down electric drive motor 6.

In detail, the treatment device 2 has the drive voltage source 70. In particular, the drive voltage source 70 has an accumulator 19.

Moreover, in the exemplary embodiment shown, the treatment device 2 is a hedge trimmer. In alternative exemplary embodiments, the treatment device can be a saw, a tree pruner, a strimmer, a hedge cutter, a blowing apparatus, a leaf blower, a lopper, a grinder, a sweeping device, a sweeping roller, a sweeping brush, a lawnmower, a scarifier or grass shears.

Furthermore, the electric drive motor 6 has a mechanical commutator. In particular, the electric drive motor 6 is a direct current machine.

Figure 5:
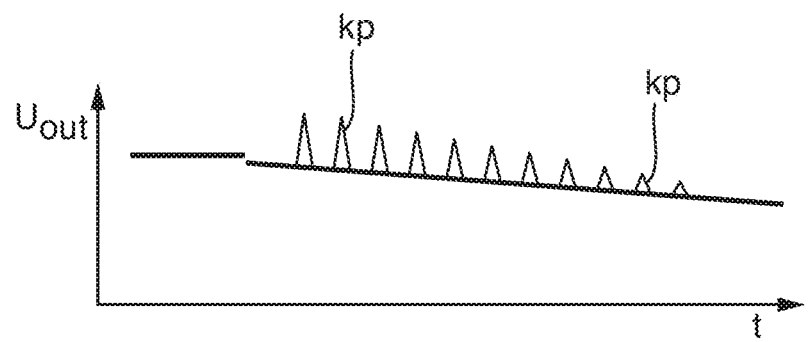
FIG. 5 shows a graph of an output voltage of an, in particular running-down, electric drive motor of the treatment device from FIG. 1 over time.

In detail, the mechanical commutator causes commutation peaks KP when the electric drive motor 6 runs down, as shown in FIG. 5. The commutation peaks KP can cause the input voltage Uin to increase, as shown in FIGS. 6 and 7.

In addition, in the exemplary embodiment shown, the closed criterion ck is that the input voltage Uin is equal to or greater than a first voltage threshold value U1. In alternative exemplary embodiments, the closed criterion can additionally or alternatively be that an increase in the input voltage is equal to or greater than a voltage increase threshold value.

In addition, in the exemplary embodiment shown, the open criterion ok is that the input voltage Uin is equal to or smaller than a second voltage threshold value U2. In alternative exemplary embodiments, the open criterion can additionally or alternatively be that a drop in the input voltage is equal to or smaller than a voltage drop threshold value.

Figure 6:
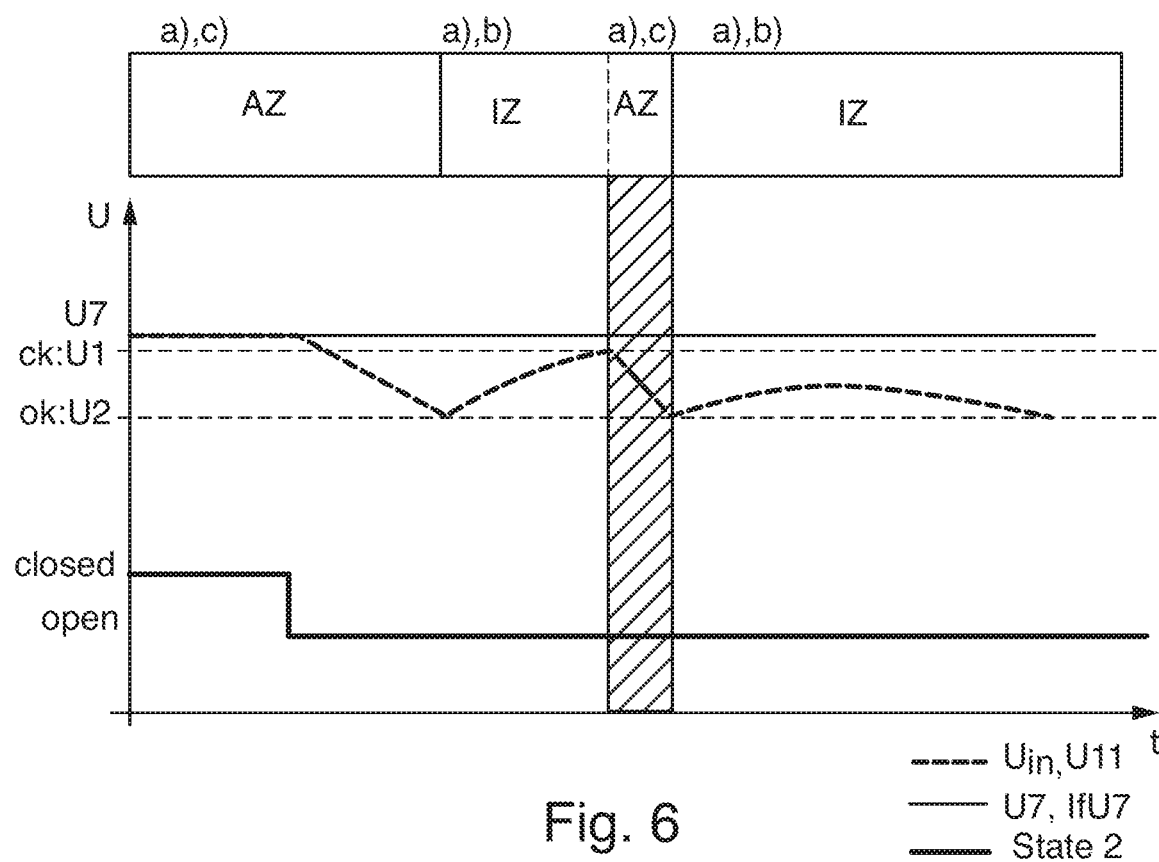
FIG. 6 shows a flow diagram, in particular a graph of a switching state of a user-operable operating switch and an input voltage at a motor electronics system over time, of a method not according to the invention.
Figure 7:
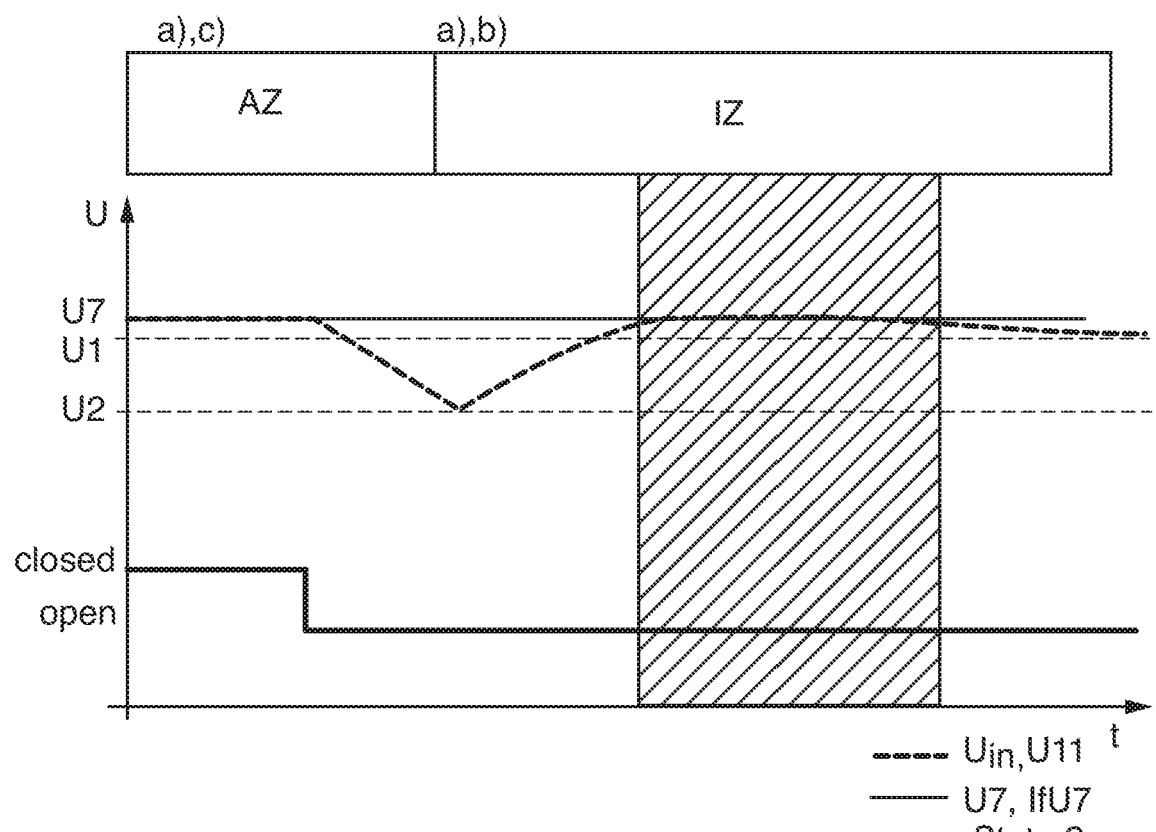
FIG. 7 shows a further flow diagram of a further method not according to the invention.

The voltage control state SZ makes it possible to prevent the closed criterion ck from being erroneously met, as shown in FIG. 6 at the start of the hatched area, despite the operating switch 2 having the open switching state open, as shown in FIG. 8.

Moreover, the treatment device 2 has a power path 9 and an information path 10 which is different from the power path 9. The power path 9 electrically connects the drive voltage source 70 to the motor electronics system 3 on the input side for a flow of electric drive power P7 from the drive voltage source 70 to the motor electronics system 3, in particular in the closed switching state closed of the operating switch 2. The operating switch 2 is arranged in an electrical manner in the power path 9. The information path 10 electrically connects the drive voltage source 70 to the motor electronics system 3, in particular to the monitoring and control apparatus 15, for information IfU7 regarding a voltage source value U7 of the drive voltage source 70. The method includes the step: specifying the closed criterion ck, in the exemplary embodiment shown the first voltage threshold value U1, and/or the open criterion ok, in the exemplary embodiment shown the second voltage threshold value U2, depending on the information IfU7 provided regarding the voltage source value U7, in particular by means of the monitoring and control apparatus 15.

In the exemplary embodiment shown, the information path 10 electrically connects the drive voltage source 70 to the motor electronics system 3, in particular to the monitoring and control apparatus 15, for a flow of electric power P15 from the drive voltage source 70 to the monitoring and control apparatus 15 for operating the monitoring and control apparatus 15, in particular in the open switching state open of the operating switch 2.

Moreover, the second voltage threshold value U2 is smaller than the first voltage threshold value U1. In particular, the second voltage threshold value U2 is at least 0.75 V smaller than the first voltage threshold value U1. Additionally or alternatively, the second voltage threshold value U2 falls within a range from 0.8 times to 0.9 times the first voltage threshold value U1.

In addition, the first voltage threshold value U1 is smaller than the voltage source value U7. In particular, the first voltage threshold value U1 is at least 0.25 V smaller than the voltage source value U7. Further additionally or alternatively, the first voltage threshold value U1 falls within a range from 0.85 times to 0.95 times the voltage source value U7.

Furthermore, the first voltage threshold value U1 additionally falls within a range from 7.5 V to 20.5 V.

Furthermore, the second voltage threshold value U2 additionally falls within a range from 6 V to 20.5 V.

Furthermore, the voltage source value U7 additionally falls within a range from 8 V to 20.5 V.

At these low voltage values, monitoring whether the input voltage meets the closed criterion, in particular that an increase in the input voltage is equal to or greater than a voltage increase threshold value, does not need to or cannot function without the voltage control state according to the invention. In particular, at these low voltage values, the input voltage can remain approximately at the level of the drive voltage or the voltage source value without the voltage control state according to the invention for a long time, as shown in FIG. 7. As a result, a rapid voltage increase in this, hatched in FIG. 7, area does not need to be or cannot be identified upon renewed operation of the operating switch. This means that a switch identification or identification of the switching state therefore does not need to be or cannot be possible in a longer period.

In addition, the method includes the step: c) if the closed criterion ck is met, operating the motor control 4 in an active state AZ for supplying the electric drive motor 6 with electrical output power Pout from the drive voltage source 70, in particular in the closed switching state closed of the operating switch 2, in particular by means of the monitoring and control apparatus 15.

In the exemplary embodiment shown, in the open switching state open of the operating switch 2, the active state AZ makes it possible for the input voltage Uin to drop and thus for the open criterion ok to be met.

Moreover, the open state set includes the voltage control state SZ for permitting an increase in the input voltage Uin caused by the drive voltage source 70 in the closed switching state closed of the operating switch 2.

The voltage control state SZ makes it possible for the closed criterion ck to be met in the closed switching state closed of the operating switch 2.

Moreover, the open state set includes the voltage control state SZ for maintaining the input voltage Uin at a voltage value U3, in the exemplary embodiment shown the second voltage threshold value U2, in particular in the open switching state open of the operating switch 2.

The voltage control state SZ makes it possible to firstly prevent a further drop in the input voltage Uin.

Furthermore, the open state set includes an inactive state IZ which is different from the voltage control state SZ for not limiting an increase in the input voltage Uin caused by the running-down electric drive motor 6, in particular in the open switching state open of the operating switch 2. Step b)

includes: temporally after operating the motor control 4 in the voltage control state, operating the motor control 4 in the inactive state IZ.

In addition, the motor control 4 has at least one, in particular first, motor switch element 12a and at least one, in particular first, protective element 13a, in particular a protective diode 14a, for protecting the motor switch element 12a. The, in particular first, protective element 13a enables an increase in the input voltage Uin caused by the running-down electric drive motor 6.

In the exemplary embodiment shown, the, in particular first, protective element 13a is arranged in an electrical manner antiparallel to the, in particular first, motor switch element 12a.

Moreover, the motor control 4 has the controllable first motor switch element 12a and a controllable second motor switch element 12b. The first motor switch element 12a is arranged in an electrical manner after the operating switch 2 and before the electric drive motor 6. The second motor switch element 12b is arranged in an electrical manner parallel to the electric drive motor 6.

Operating the motor control 4 in the active state AZ includes: controlling the first motor switch element 12a alternately in an on state on and in an off state off, in particular by means of pulse width modulation PWM, in particular by means of the monitoring and control apparatus 15.

In addition, operating the motor control 4 in the voltage control state SZ includes: controlling the first motor switch element 12a alternately in the on state on and in the off state off, in particular by means of pulse width modulation PWM, in particular by means of the monitoring and control apparatus 15.

Furthermore, operating the motor control 4 in the inactive state IZ additionally includes: controlling the first motor switch element 12a continuously in the off state off, in particular by means of the monitoring and control apparatus 15.

Furthermore, operating the motor control 4 in the active state AZ additionally includes: controlling the second motor switch element 12b alternately in an on state on and in an off state off, in particular by means of pulse width modulation PWM, in particular by means of the monitoring and control apparatus 15.

Furthermore, operating the motor control 4 in the voltage control state SZ additionally includes: controlling the second motor switch element 12b alternately in the on state on and in the off state off, in particular by means of pulse width modulation PWM, in particular by means of the monitoring and control apparatus 15.

Furthermore, operating the motor control 4 in the inactive state IZ additionally includes: controlling the second motor switch element 12b continuously in the off state off, in particular by means of the monitoring and control apparatus 15.

In the exemplary embodiment shown, operating the motor control 4 in the active state AZ and in the voltage control state SZ includes: controlling the first motor switch element 12a and the second motor switch element 12b by means of complementary pulse width modulation PWM.

In alternative exemplary embodiments, operating the motor control in the voltage control state can include: controlling the first motor switch element continuously in the off state.

Moreover, the motor control 4 has a second protective element 13b, in particular a protective diode 14b, for protecting the second motor switch element 12b.

In the exemplary embodiment shown, the second protective element 13b is arranged in an electrical manner antiparallel to the second motor switch element 12b.

Furthermore, the motor electronics system 3 has at least one intermediate circuit capacitor 11. The input voltage Uin is an intermediate circuit voltage U11 of the at least one intermediate circuit capacitor 11.

Figure 4:
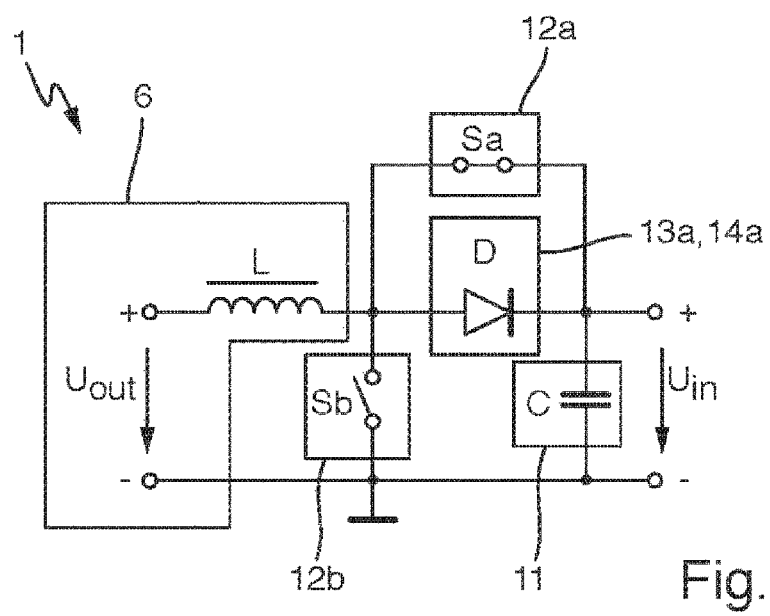
FIG. 4 shows a circuit diagram of the treatment device from FIG. 1.

In the exemplary embodiment shown, the intermediate circuit capacitor 11, the first protective diode 14a, the second motor switch element 12b, the first motor switch element 12a and the electric drive motor 6 form a step-up converter, as shown in FIG. 4.

In alternative exemplary embodiments, the intermediate circuit capacitor, the first protective diode, the second motor switch element and the electric drive motor can form a step-up converter.

In detail, the electric drive motor 6 as inductance L is connected in series to the protective diode 14a as freewheeling diode D, behind which the intermediate circuit capacitor 11 as charging capacitor C adds up the output voltage Uout. The electric drive motor 6 as inductance L can be connected to ground GND through the second motor switch element 12b as switch Sb. The second motor switch element 12b as switch Sb is used in order to generate the, in particular constant, input voltage/intermediate circuit voltage Uin, U11 from the dropping output voltage Uout, in particular of the electric drive motor 6, according to the step-up converter principle. The first motor switch element 12a as switch Sa is controlled in the on state on if the second motor switch element 12b is controlled in the off state off, so that the input voltage/intermediate circuit voltage Uin/U11 does not increase caused by the running-down electric drive motor 6, in particular caused by the commutation peaks KP.

The use of the motor electronics system 3, in particular the motor control 4, as a step-up converter and the use of the induced output voltage Uout of the running-down electric drive motor 6 therefore makes it possible to maintain the input voltage Uin, in particular the intermediate circuit voltage Ulf, at the voltage value U3, in particular the second voltage threshold value U2.

This makes it possible to firstly prevent a further drop in the input voltage Uin. This therefore makes it possible to keep an inrush current low upon renewed operation or in the closed switching state closed of the operating switch 2. In particular, this can make it possible to prevent damage to the motor electronics system 3, in particular to the intermediate circuit capacitor 11.

In addition, the control in the active state AZ makes it possible to supply the electric drive motor 6 with electrical output power Pout from the drive voltage source 70 in the closed switching state closed of the operating switch 2 and/or for the input voltage Uin to drop, in particular the intermediate circuit voltage Ulf, in particular discharge the intermediate circuit capacitor 11, in the open switching state open of the operating switch 2.

Furthermore, the control in the voltage control state SZ additionally makes it possible to limit the increase in the input voltage Uin, in particular maintain the input voltage Uin, in the open switching state open of the operating switch 2, and/or to permit the increase in the input voltage Uin, in particular the intermediate circuit voltage Ulf, in particular charge the intermediate circuit capacitor 11, in the closed switching state closed of the operating switch 2.

Furthermore, the control in the inactive state IZ, in particular in the open switching state open of the operating switch 2, additionally makes it possible to not limit the increase in the input voltage Uin, in particular the intermediate circuit voltage Ulf, in particular charge the intermediate circuit capacitor 11.

Figure 3:
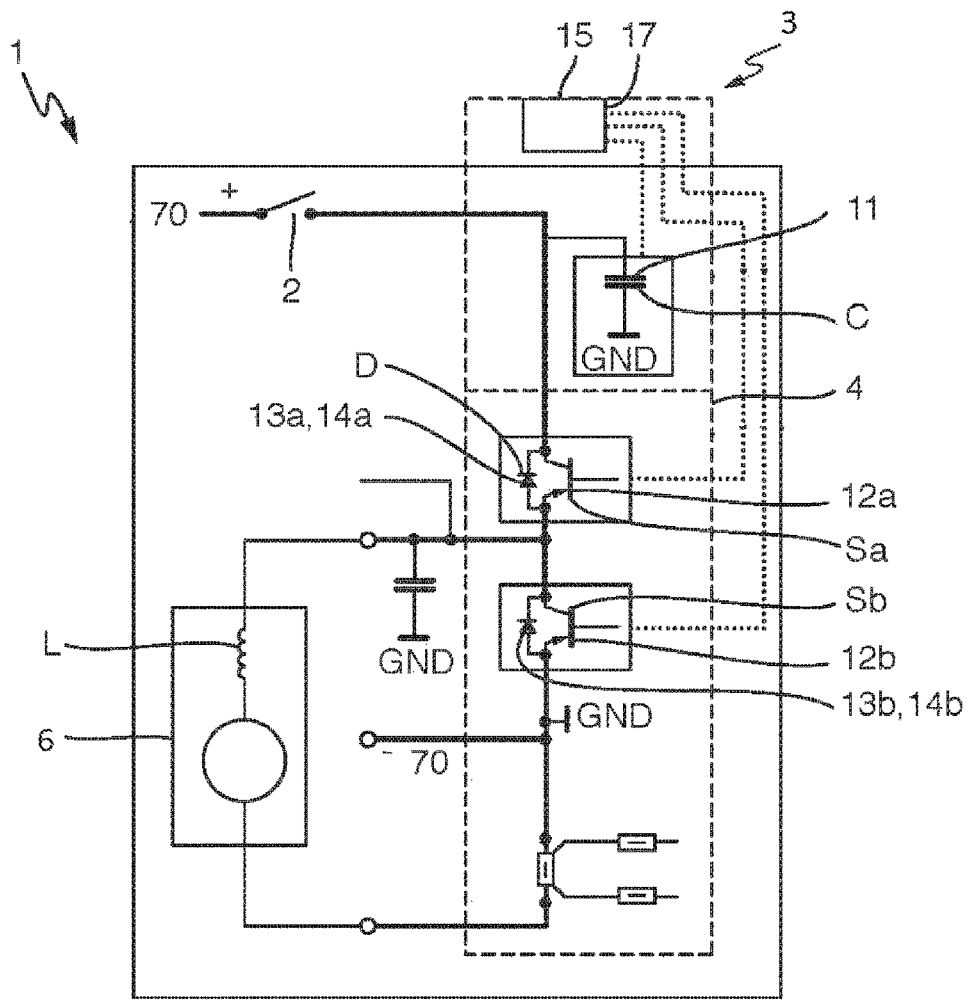
FIG. 3 shows a detailed equivalent circuit diagram of a cut-out of the treatment device from FIG. 1.

In addition, in the exemplary embodiment shown, the monitoring and control apparatus 15 is designed to cooperate with the first motor switch element 12a, the second motor switch element 12b and the intermediate circuit capacitor 11, as indicated in FIG. 3 by dotted lines.

Moreover, the method includes the step: if the closed criterion is met, performing a self-test of the treatment device 1, in particular by means of a self-test device 17 of the treatment device 1, and/or outputting user-accessible information If18, in particular by means of an output device 18 of the treatment device 1.

In the exemplary embodiment shown, the output device 18 has an output device circuit board having a display in the form of a plurality of LEDs.

Moreover, in the exemplary embodiment shown, the information path 10 electrically connects the drive voltage source 70 to the self-test device 17 and/or to the output device 18 for a flow of electric power P17, P18 from the drive voltage source 70 to the self-test device 17 and/or to the output device 18 for operating the self-test device 17 and/or the output device 18, in particular in the open switching state open of the operating switch 2.

As is made clear in the exemplary embodiments shown and explained above, the invention provides an advantageous method for operating an electrical treatment device and an advantageous electrical treatment device, which in each case has improved properties.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for operating an electrical treatment device, wherein the treatment device comprises:
   a user-operable operating switch, a motor electronics system having a motor control and an electric drive motor,
   wherein the operating switch is electrically connected to a drive voltage source on an input side and to the motor electronics system on an output side, and
   wherein the motor electronics system is electrically connected to the electric drive motor on an output side by way of the motor control,
   wherein the method comprises the steps of:
   a) monitoring whether an input voltage at the motor electronics system meets a closed criterion or an open criterion, wherein the closed criterion is characteristic of a closed switching state of the operating switch, and wherein the open criterion is characteristic of an open switching state of the operating switch; and
   b) when the open criterion is met, operating the motor control in a state from an open state set, wherein the open state set includes a voltage control state for limiting an increase in the input voltage caused by a running-down electric drive motor,
   wherein the open state set further includes an inactive state which is different from the voltage control state for not limiting an increase in the input voltage caused by the running-down electric drive motor, and step b) includes: temporally after operating the motor control in the voltage control state, operating the motor control in the inactive state.

2. The method according to claim 1, wherein the electric drive motor has a mechanical commutator.

3. The method according to claim 1, wherein at least one of:
   the closed criterion is that the input voltage is equal to or greater than a first voltage threshold value and/or that an increase in the input voltage is equal to or greater than a voltage increase threshold value, and
   the open criterion is that the input voltage is equal to or smaller than a second voltage threshold value and/or that a drop in the input voltage is equal to or smaller than a voltage drop threshold value.

4. The method according to claim 3,
   wherein the treatment device has a power path and an information path which is different from the power path,
   wherein the power path electrically connects the drive voltage source to the motor electronics system on the input side for a flow of electric drive power from the drive voltage source to the motor electronics system, and wherein the operating switch is arranged in an electrical manner in the power path, and
   wherein the information path electrically connects the drive voltage source to the motor electronics system for information regarding a voltage source value of the drive voltage source,
   wherein the method further comprises the step of:
   specifying at least one of: the closed criterion, including the first voltage threshold value and/or the voltage increase threshold value, and the open criterion, including the second voltage threshold value and/or the voltage drop threshold value, depending on the information provided regarding the voltage source value.

5. The method according to claim 4, wherein at least one of:
   the second voltage threshold value is smaller than the first voltage threshold value, wherein the second voltage threshold value is at least 0.75 V smaller than the first voltage threshold value and/or falls within a range from 0.8 times to 0.9 times the first voltage threshold value,
   the first voltage threshold value is smaller than the voltage source value, wherein the first voltage threshold value is at least 0.25 V smaller than the voltage source value and/or falls within a range from 0.85 times to 0.95 times the voltage source value,
   the first voltage threshold value falls within a range from 7.5 V to 20.5 V,
   the second voltage threshold value falls within a range from 6 V to 20.5 V, and
   the voltage source value falls within a range from 8 V to 20.5 V.

6. The method according to claim 1, wherein the method further comprises the step of:
   c) when the closed criterion is met, operating the motor control in an active state for supplying the electric drive motor with electrical output power from the drive voltage source.

7. The method according to claim 6, wherein
   the motor control has a controllable first motor switch element, wherein the first motor switch element is arranged in an electrical manner after the operating switch and before the electric drive motor, and/or a controllable second motor switch element, wherein the second motor switch element is arranged in an electrical manner parallel to the electric drive motor, and
operating the motor control in the active state includes at least one of:
(i) controlling the first motor switch element alternately in an on state and in an off state by pulse width modulation, and/or wherein operating the motor control in the voltage control state includes: controlling the first motor switch element alternately in the on state and in the off state by pulse width modulation, and/or wherein operating the motor control in the inactive state includes: controlling the first motor switch element continuously in the off state, and
(ii) controlling the second motor switch element alternately in an on state and in an off state by pulse width modulation, and/or wherein operating the motor control in the voltage control state includes: controlling the second motor switch element alternately in the on state and in the off state by pulse width modulation, and/or wherein operating the motor control in the inactive state includes: controlling the second motor switch element continuously in the off state.

8. The method according to claim 1, wherein
the open state set includes the voltage control state for permitting an increase in the input voltage caused by the drive voltage source in the closed switching state of the operating switch.

9. The method according to claim 1, wherein
the open state set includes the voltage control state for maintaining the input voltage at a voltage value.

10. The method according to claim 1, wherein
the motor control has at least one motor switch element and at least one protective element for protecting the motor switch element, and
the protective element enables an increase in the input voltage caused by the running-down electric drive motor.

11. The method according to claim 1, wherein
the motor electronics system has at least one intermediate circuit capacitor, and
the input voltage is an intermediate circuit voltage of the at least one intermediate circuit capacitor.

12. The method according to claim 1, wherein the method further comprises the step of:
when the closed criterion is met, performing a self-test of the treatment device and/or outputting user-accessible information.

13. An electrical treatment device, comprising:
a user-operable operating switch, a motor electronics system having a motor control and having a monitoring and control apparatus and an electric drive motor,
wherein the operating switch is designed to electrically connect to a drive voltage source on an input side and is electrically connected to the motor electronics system on an output side,
wherein the motor electronics system is electrically connected to the electric drive motor on an output side by way of the motor control, and
wherein the monitoring and control apparatus is designed to:
monitor whether an input voltage at the motor electronics system meets a closed criterion or an open criterion, wherein the closed criterion is characteristic of a closed switching state of the operating switch, and wherein the open criterion is characteristic of an open switching state of the operating switch, and
when the open criterion is met, operate the motor control in a state from an open state set, wherein the open state set includes a voltage control state for limiting an increase in the input voltage caused by a running-down electric drive motor and an inactive state which is different from the voltage control state for not limiting an increase in the input voltage caused by the running-down electric drive motor, and
temporally after operating the motor control in the voltage control state, operate the motor control in the inactive state.

14. The electrical treatment device according to claim 13, wherein the treatment device comprises:
the drive voltage source including an accumulator.

* * * * *